United States Patent
Poulton et al.

(10) Patent No.: US 10,069,505 B1
(45) Date of Patent: Sep. 4, 2018

(54) LEAST SIGNIFICANT BIT DYNAMIC ELEMENT MATCHING IN A DIGITAL-TO-ANALOG CONVERTER

(71) Applicant: Keysight Technologies, Inc., Minneapolis, MN (US)

(72) Inventors: Kenneth D. Poulton, Palo Alto, CA (US); Robert Edward Jewett, Berkeley, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 15/703,401

(22) Filed: Sep. 13, 2017

(51) Int. Cl.
*H03M 1/06* (2006.01)

(52) U.S. Cl.
CPC .................. *H03M 1/0641* (2013.01)

(58) Field of Classification Search
CPC ........ H03M 1/0641; H03M 1/10; H03M 1/66; H03M 1/802; H03M 1/804; H03M 1/806
USPC ................ 341/144, 131, 138, 172, 118, 120
See application file for complete search history.

(56) References Cited

U.S. PATENT DOCUMENTS

| | | | | |
|---|---|---|---|---|
| 4,430,642 A | * | 2/1984 | Weigand ................. | H03M 1/68 341/120 |
| 4,503,421 A | * | 3/1985 | Hareyama ............... | H03M 1/10 341/145 |
| 4,751,496 A | * | 6/1988 | Araki .................. | H03M 1/0639 341/131 |
| 4,994,803 A | | 2/1991 | Blackham | |
| 4,994,804 A | | 2/1991 | Sakaguchi | |
| 6,466,149 B2 | * | 10/2002 | Tabler ................. | H03M 1/0602 341/138 |
| 6,967,609 B1 | * | 11/2005 | Bicakci ............ | H03K 17/04106 341/144 |
| 7,286,075 B2 | * | 10/2007 | Hennessy ........... | H03M 1/0639 341/144 |
| 7,289,071 B2 | * | 10/2007 | Hung ...................... | H01Q 9/42 343/702 |
| 7,696,909 B2 | * | 4/2010 | Oberhuber ............... | G05F 3/30 327/307 |
| 2006/0261998 A1 | * | 11/2006 | Cho ..................... | H03M 1/682 341/172 |
| 2008/0036635 A1 | * | 2/2008 | Lin ..................... | H03M 1/069 341/144 |
| 2009/0086104 A1 | * | 4/2009 | Felder ................... | H04N 5/268 348/705 |
| 2010/0328126 A1 | * | 12/2010 | Lee ........................ | H03M 1/76 341/144 |

(Continued)

OTHER PUBLICATIONS

Kok Lim Chan et al., "Dynamic Element Matching to Prevent Nonlinear Distortion From Pulse-Shape Mismatches in High-Resolution DACs", IEEE Journal of Solid-State Circuits, vol. 43, No. 9, Sep. 2008, pp. 2067-2078.

*Primary Examiner* — Jean B Jeanglaude

(57) ABSTRACT

A circuit for digital-to-analog conversion includes a first digital-to-analog converter (DAC), a second DAC, and an output node. The first DAC provides charges from multiple first charge sources segmented into a first group for most significant bits of a digital input to the first DAC and a second group for least significant bits of the digital input. Dither is both added to the digital input to the first DAC and used as sole digital input to the second DAC. Analog output from the second DAC is subtracted from analog output of the first DAC at the output node so as to cancel the dither added to the first DAC.

20 Claims, 8 Drawing Sheets

(56) References Cited

U.S. PATENT DOCUMENTS

2012/0194373 A1* 8/2012 Steinbach ............ H03M 1/661
                                                 341/144

* cited by examiner (BEFORE)**

Amplitude
(dBc)

Frequency
(GHz)

(AFTER)**

Amplitude
(dBc)

Frequency
(GHz)

US 10,069,505 B1

LEAST SIGNIFICANT BIT DYNAMIC ELEMENT MATCHING IN A DIGITAL-TO-ANALOG CONVERTER

BACKGROUND

Digital input represents a code as a digital input code. A digital-to-analog converter (DAC) converts digital input into analog output. The analog output is output as an analog output signal. For analog output, a repeating or periodic waveform may present a problem due to periodicity, i.e., due to being periodic. When the analog output is generated based on digital input in a DAC, mismatch errors among the DAC elements also become periodic. In the frequency domain, the periodic errors may manifest as a smaller number of discrete spectral components or harmonics with higher power, compared to a non-periodic signal, which in turn tends to result in a reduced spurious-free dynamic range (SFDR).

Dither can be added to the digital input to generate a small amount of random noise. For example, dither similar in size or larger than the errors can be added to the digital input before the digital input enters the DAC. This has the effect of "randomizing" the element errors and making them non-periodic, resulting in a larger number of harmonics with lower amplitude levels, spread out over a wider spectrum. This technique can potentially raise the noise floor, but results in a better spurious-free dynamic range.

Dither can be added to the digital DAC input, and then removed by an analog filter at the DAC output.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
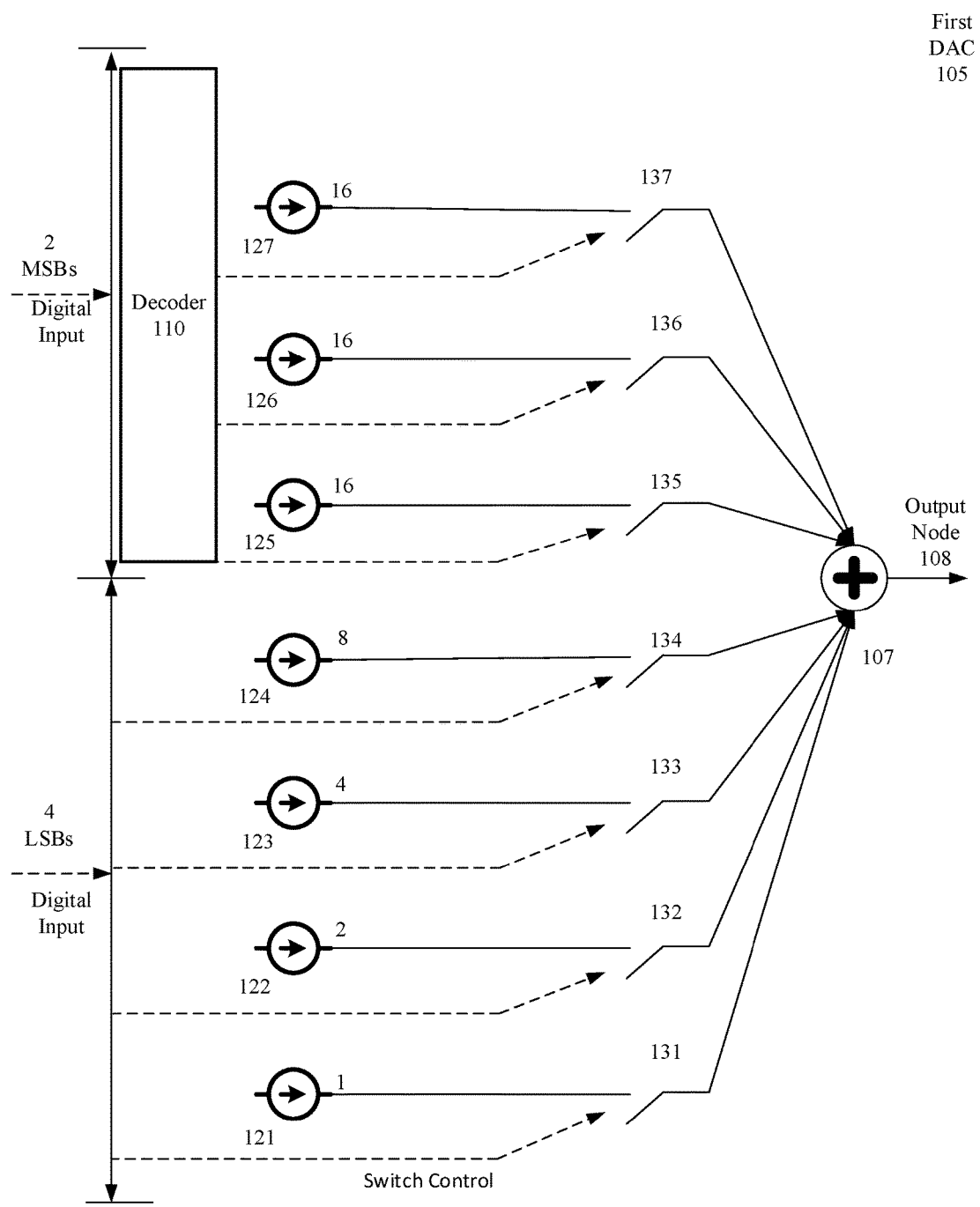
FIG. 1 illustrates a diagram of a first digital-to-analog converter used in least significant bit dynamic element matching in a digital-to-analog converter, in accordance with a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing embodiments only, and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the present teachings.

The terminology used herein is for purposes of describing embodiments only, and is not intended to be limiting. As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

In view of the foregoing, the present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

FIG. 1 illustrates a diagram of a first digital-to-analog converter used in least significant bit dynamic element matching in a digital-to-analog converter, in accordance with a representative embodiment. In the description that follows, digital-to-analog converters will be consistently referred to by the acronym "DACs" to enhance readability of the description. A DAC is generally a device that receives digital input and converts the digital input into analog output. DACs are typically implemented with a positive output node and a negative output node, so that the DAC is able to provide a differential output signal, although a single-ended signal may be output, e.g., by the positive output node in various configurations.

In FIG. 1, a first DAC 105 includes seven (7) first current sources 121-127, seven (7) switches 131-137, a summer 107, an output node 108, and a decoder 110. Notably, the number of first current sources and switches may vary to provide unique benefits for any particular situation or to meet application specific design requirements of various implementations, without departing from the scope of the present teachings, as would be apparent to one skilled in the art.

In FIG. 1, three (3) current sources 125, 126, 127 are three (3) unary/equal-weighted current sources that are controlled by two (2) binary bits of digital input. The two (2) binary bits can have four (4) states, i.e., states 0, 1, 2, 3.

In FIG. 1, each of the seven (7) first current sources 121-127 is connected to a corresponding switch among the switches 131-137. The first current sources 121-127 may be considered first current sources for a circuit that includes the first DAC 105. The circuit may be, but is not required to be, an integrated circuit. The first current sources 121-127 include current source 121, current source 122, current source 123, current source 124, current source 125, current source 126, and current source 127. Each of the first current sources 121-127 provides a fixed amount of current. The fixed amounts of current provided by the first current sources 121-127 may all be the same, may all be different, or may be a combination with some being the same as others and some being unique among the fixed amounts of current.

In FIG. 1, the decoder 110 decodes two (2) MSBs to three (3) switch control bits that individually control the first current sources 125-127. In FIG. 1, these first current sources 125-127 are equal-weighted, whereas the first current sources 121-124 are binary-weighted. There are a variety of ways to describe the relationship between the number of MSBs and the number of first current sources 125-127, including that the number of first current sources 125-127 used for a particular digital input may be more than the number of MSBs. A portion of current sources dedicated for use for MSBs may sometimes be extra and unused, such as when not all the MSBs of a digital input are positive values of 1 (one). In FIG. 1 the combined decimal value for the MSBs of bits at the 5th and 6th position would be 48 (forty-eight), so that all three (3) of the first current sources 125-127 are switched on. Current sources can be varied even for the same digital input, so that different subsets of first current sources 125-127 are used for the same digital input at different times.

Current sources are generally used for descriptions of embodiments herein. However, current sources are a form of charge sources that provide energy for DACs. Other forms of charge sources use capacitors. An example of a DAC that uses current is a R/2R DAC. Examples of DACs that use other forms of charge sources such as capacitors include, e.g., capacitor (charge) DACs, resistive ladder DACs, capacitive ladder DACs, and C/2C DAC. Thus, the use of the term "current source" herein is merely a convenience, and these are representative of charge sources generally.

In FIG. 1, the first DAC 105 includes seven (7) switches 131-137. The switches 131-137 are each connected between the summer 107 and a corresponding current source among the first current sources 121-127. The fixed amount of current from each of the seven (7) first current sources 121-127 is variably provided to the summer 107 via the corresponding switch among the switches 131-137. The switches 131-137 are opened or closed based on the digital input received by the first DAC 105. The characteristics of the digital input include both bit position and bit value, and are explained below. In FIG. 1, the switch control bits that controls the switches 131-137 are represented by dashed lines and arrows pointing to each of the switches 131-137. Switch control bits are derived from the digital input, and may correspond exactly to individual bits on a one-to-one (1-to-1) basis for binary-weighted current sources but not for equal-weighted current sources.

In detail, the first DAC 105 may include a positive node and a negative node. When any of the switches 131-137 are closed, the current provided over the closed switch is provided to the positive node. When any of the switches 131-137 are open, the current from the corresponding current source among first current sources 121-127 is carried to the negative node.

In FIG. 1, the first DAC 105 includes a summer 107 and an output node 108. The summer 107 sums the currents received via any switch or switches among the seven (7) switches 131-137 that are closed. Output node 108 emits the summed currents summed by the summer 107. More particularly, the current source 127 can be connected to the summer 107 and output node 108 by switch 137. Current source 126 can be connected to the summer 107 and output node 108 by switch 136. Current source 125 can be connected to the summer 107 and output node 108 by switch 135. Current source 124 can be connected to the summer 107 and output node 108 by switch 134. Current source 123 can be connected to the summer 107 and output node 108 by switch 133. Current source 122 can be connected to the summer 107 and output node 108 by switch 132. Current source 121 can be connected to the output node 108 by switch 131.

As explained above, the first current sources 121-127 provide fixed amounts of current. However, the output of each of the first current sources 121-127 is only provided to the summer 107 when the corresponding switch among switches 131-137 for each of the current sources is closed. The switches 131-137 are controlled based on characteristics of digital input. The characteristics can include bit position and bit value. Bit position reflects a weight of a specific bit in the bit position, in the same way that a position of a digit in the decimal system reflects a weight. Bit value reflects the specific information of the bit in the bit position, in the same way that a digit value in the decimal system reflects the specific information of the digit in the digit position.

As an example, in the embodiment of FIG. 1, the first DAC 105 may be provided with six (6) bits of digital input, so that currents may be generated in states from 0 to $2^6-1$ (i.e., in 63 states). In this example, four (4) LSB bits of the six (6) bits of digital input are used to control four (4) current sources, i.e., current source 121, current source 122, current source 123, and current source 124 respectively. The other two (2) MSB bits of the six (6) bits of digital input are used to control another three (3) current sources, i.e., current source 125, current source 126, and current source 127.

That is, in FIG. 1, the first current sources 125-127 are grouped for the two (2) MSB bits of the six (6) bits of digital input. The first current sources 121-124 are grouped for the 4 LSB bits of the six (6) bits of digital input. Accordingly, the first current sources 125-127 may be considered a first group for MSB bits, and the first current sources 121-124 may be considered a second group for LSB bits.

As described above, the first current sources 121-127 can be considered segmented between the first group of first current sources 125-127 and the second group of first current sources 121-124. The segmenting may involve treating each group differently or providing each group with characteristics not provided to the other group, and is not a mere arbitrary logical separation between two (2) groups. Moreover, each group exclusively includes members that do not belong to the other group. The first group of first current sources 125-127 includes three (3) current sources for the two (2) MSB bits, and thus the quantity of the first group of first current sources 125-127 is greater than the quantity of the two (2) MSB bits. The second group of first current sources 121-124 includes four (4) current sources, but for four (4) LSB bits, and thus the quantity of the second group of first current sources 121-124 is equal to the quantity of four (4) LSB bits.

Segmenting addresses a linearity problem for DACs. A segmented DAC architecture that includes the first DAC 105 in FIG. 1 may include four (4) of the first current sources 121-127 corresponding on the one-to-one (1-to-1) basis with four (4) LSB bits of digital input. In this embodiment, these first current sources 121-124 of the second group represent binary scaling of the four (4) LSB bits. However, the second group of first current sources 121-124 does not necessarily require binary weighting in the LSBs, and alternatives such as radix<2 (e.g., 1.8× scaling from bit to bit) can also be used.

The segmented DAC architecture that includes the first DAC 105 in FIG. 1 may also include three (3) of the first current sources 121-127 dedicated for the two (2) MSB bits of the digital input. These first current sources 125-127 are equal-weighted rather than binary-weighted for the two (2) MSB bits. That is, each of the first current sources 125-127 provides an equal amount of current, whereas the amount of current from first current sources 121-124 increases by a factor of two (2) from each to the next. For the example of FIG. 1, the ratio between the largest and smallest current source among the first current sources 121-127 can be reduced using equal-weighting from 32:1 (for all binary-weighting) to 16:1 (for segmenting using binary-weighting and equal-weighting) using N=6, M=2 and L=4 where N is the total number of bits, M is the number of MSB bits, and L is the number of LSB bits. In another example, the improvement is even greater, i.e., from 2048:1 (for all binary-weighting) to 256:1 (for segmenting using binary-weighting and equal-weighting), when N=12, M=4 and L=8. In other words, the equal-weighting for the first current sources 125-127 for the MSB bits improves linearity compared to using all binary-weighting for current sources in a DAC. The linearity problem is otherwise due to the difficulty of accurately generating currents over several orders of magnitude (e.g., 2048-1) in scale. As a result, the first current sources 121-127 in the first DAC 105 in FIG. 1 are segmented such that current sources among the first current sources 121-127 are divided into different groups for MSB bits and LSB bits. Thus, the first current sources 125-127 are equal-weighted rather than binary-weighted.

Next, the relationship between each group of bits (LSB bits and MSB bits) of digital input and the amount of first current sources 121-127 that are dedicated to each group of bits is explained as follows. For LSB bits, first current sources 121-124 are dedicated on a one-to-one (1-to-1) basis. Thus, the four (4) first current sources 121-124 are dedicated for the four (4) LSB bits. Specifically, current source 121 is dedicated to the lowest weighted bit, current source 122 is dedicated to the second lowest weighted bit, current source 123 is dedicated to the third lowest weighted bit, and current source 124 is dedicated to the fourth lowest weighted bit.

For MSB bits, first current sources 125-127 are dedicated on an exponential basis of $2^M-1$, where M is the number of states made possible by the MSB bits and corresponds to the lowest bit position of the MSB bits among the digital input. This is based on a presumption that the granularity of all of the dedicated current sources is set at the positive binary value that would be attributed to the MSB bit at the lowest MSB bit position. For example, with seven (7) digital input bits and three (3) MSB bits, the lowest MSB bit position is the fifth bit position of the seven (7) digital input bits. The fifth bit position has a positive binary value of sixteen (16), i.e., $2^{(P-1)}$, where P is the position of the lowest MSB bit position.

Thus, the three (3) current sources including current source 125, current source 126, and current source 127, are dedicated for the two (2) MSB bits as a group rather than on a one-to-one (1-to-1) basis. Several examples of the $2^M-1$ relationship between the amount of MSB bits and the number of dedicated current sources dedicated to the MSB bits follow. In this regard, a single most significant bit of digital input would have one (1) dedicated current source. Two (2) most significant bits of digital input would have three (3) dedicated current sources, as is the case with the embodiment of FIG. 1. Three (3) most significant bits of digital input would have seven (7) dedicated current sources. Four (4) most significant bits of digital input would have 15 dedicated current sources. Five (5) most significant bits of digital input would have thirty-one (31) dedicated current sources. Six (6) most significant bits of digital input would have sixty-three (63) dedicated current sources.

Additionally, it may be easier to permute current sources when the number of such current sources is equal to a power of two (2), such as two (2), four (4), eight (8) or sixteen (16). Therefore, the number of total current sources provided may be targeted close to $2^M$, where M is the number of MSB bits. For example, sixteen (16) current sources may be controlled by five (5) binary bits of digital data with 1 LSB bit corresponding on a one-to-one basis with one (1) current source and four (4) binary bits of digital data corresponding on a $2^M-1$ basis with fifteen (15) dedicated current sources. Accordingly, an additional benefit may be obtained insofar as the dedicated current sources for MSB bits are set at $2^M-1$, when the total number of current sources for all bits are $2^M$.

For the embodiment of FIG. 1, each of four (4) LSB bits corresponds to a different switch among switches 131-134, and the corresponding switch is closed when the corresponding bit has a value of "1". The currents from first current sources 121-124 are exponentially proportional (i.e., $2^{P-1}$) to the corresponding bit position of the four (4) LSB bits, where P is the bit position of each of the four (4) LSB bits. Therefore, current from current source 121 is weighted "1" and is provided when switch 131 is closed based on the lowest weighted bit having a value of "1". Current from current source 122 is weighted "2" and is provided when switch 132 is closed based on the second lowest weighted bit having a value of "1". Current from current source 123 is weighted "4" and is provided when switch 133 is closed based on the third lowest weighted bit having a value of "1". Current from current source 124 is weighted "8" and is provided when switch 134 is closed based on the fourth lowest weighted bit having a value of "1". On the other hand, current from current source 121 is not provided when switch 131 is open based on the lowest weighted bit having a value of "0". Current from current source 122 is not provided when switch 132 is open based on the second lowest weighted bit having a value of "0". Current from current source 123 is not provided when switch 133 is open based on the third lowest weighted bit having a value of "0". Current from current source 124 is not provided when switch 134 is open based on the fourth lowest weighted bit having a value of "0".

Additionally, two (2) MSB bits together correspond generally to switches 135-137, and these switches 135-137 are opened and closed on a different basis than switches 131-134. That is, each of switches 135-137 is open or closed based on both the values of the two (2) MSB bits, and on how the arrangement between the two (2) MSB bits and the selection of first current sources 125-127 and switches 135-137 is permuted. In the description that follows, permutation (also known as dynamic element matching) may be used descriptively for individual MSB bits, first current sources 125-127 dedicated to MSB bits, or switches 135-137. However, permutation refers in each instance to which of the current sources dedicated to MSB bits is used to provide current for a digital input, as the first current sources 125-127 used to provide current for MSB bits are varied pseudo-randomly or randomly for the reasons described herein. Additionally, the current from first current sources 125-127 are all equal-weighted "16", and are provided based on the switches 135-137 being closed. However, the switches 135-137 are not closed on a one-to-one (1-to-1) correspondence with either of the two (2) MSB bits, and are instead closed based on the values of the two (2) MSB bits and on the permutation for the three (3) MSB control bits for each digital input based on the two (2) MSB bits. The current sources can be permuted for each different sequential digital input received by the first DAC 105, or based on a pre-established pattern such as after every three (3), or every five (5), different sequential digital inputs received by the first DAC 105.

The relationship between MSB bits and first current sources 125-127 based on bit values is explained as follows. In the example of a 6-bit digital input, the six (6) bits carry positive values of 1, 2, 4, 8, 16 and 32. Thus, the two (2) MSB bits carry positive values of 16 and 32. When both are set to the positive values, the combined value is forty-eight (48). When only the most significant bit of the two (2) MSB bits carries a positive value, the combined value is thirty-two (32). When only the second most significant bit of the two (2) MSB bits carries a positive value, the combined value is sixteen (16). When neither of the two (2) MSB bits carries a positive value, the combined value is zero (0). Therefore, the number of first current sources 125-127 to be used for any individual digital input depends on which, if any, of the two (2) MSB bits carries a positive value.

Based on the four (4) possible combined values of 0, 16, 32, 48, only one (1) of the four (4) possible combined values would require current from all three (3) of the first current sources 125-127. For a combined value of 0, none of the first current sources 125-127 is required. For a combined value of 16, only one (1) of the first current sources 125-127 is required. For a combined value of 32, only two (2) of the first current sources 125-127 is required. And for a combined value of 48, all three (3) of the first current sources 125-127 are required. Therefore, more first current sources 125-127 may exist than may be needed for several of the possible combined values of the two (2) MSB bits in the example.

The first current sources 125-127 are permuted, for example, to address mismatch errors in the first current sources 125-127 that still show up as errors such as integral nonlinearity (INL), differential nonlinearity (DNL) or spurious frequencies (spurs) in the frequency domain. The permuting is a technique that is also known as dynamic element matching (DEM). Using dynamic element matching for a segmented DAC, the switches 135-137 are controlled in accordance with the two (2) MSB bits of the digital input. The switches 135-137 collectively switch the group of first current sources 125-127 for the two (2) MSB bits, and the arrangement of switches 135-137 used for any combination of the two (2) MSB bits can be changed pseudo-randomly or randomly, or according to an algorithm such as data-weighted averaging. As a result, for a given digital input, the right number of first current sources 125-127 for the two (2) MSB bits are connected, but the actual current sources among first current sources 125-127 that are connected can vary even in different instances using the same two (2) MSB bits of the digital input. That is, with pseudo-random or random permuting, any mismatch between the first current sources 125-127 for the two (2) MSB bits is averaged out and, with enough averaging, the current contributed by the first current sources 125-127 for the two (2) MSB bits will scale arbitrarily well such that the effect on INL, DNL and spurs will be reduced. In the examples below for FIG. 1, the number (i.e., amount) of MSB bits is two (2), but in other examples the number of MSB bits may be one (1), three (3), four (4) or any other number, and the dedicated pool of current sources for MSB bits will be exponential such as $2^M-1$ as set forth previously.

Permuting/dynamic element matching as described herein does not entirely resolve current mismatch errors for the MSBs. For example, if the permuting is uniformly pseudo-random, the noise from the permuting will be white. If the permuting is dependent on the input code, such as in data-weighted averaging, the noise will vary based on the input signal and may be deliberately shaped to one part of the spectrum and show spurs and humps. Moreover, permuting does not resolve errors in the first current sources 121-124, i.e., for the least-significant-bits.

The concept of dither is explained next, in the context of FIG. 1. One kind of error that can occur in simulations occurs when currents for LSB bits are not as large as they should be relative to currents for MSBs. For example, currents for the LSB bits may be smaller than the correct size. Many harmonics of the fundamental are generated by this kind of error. One of the primary harmonics is generated by repeating steps on the steepest parts of the sine wave. For a full-scale signal on a DAC with K current sources for the MSB bits, strong harmonics are present out to approximately n*K*Fsig. If K=16 in the simulation, this is the 49th harmonic. The effect of this kind of error on the frequency domain is seen in a simulation in FIG. 8A. The error might be only 0.1%, and the spurs could still be numerous and prominent in the frequency domain. Harmonics up to the 49th harmonic could be present, and even higher harmonics, at lower levels. Due to the sampled nature of a DAC, the harmonics beyond the Nyquist frequency are folded back into the region from direct current (DC) to the Nyquist frequency. Dither can be added to the digital input to help with LSB bit errors.

Dither is a signal with randomized digital codes added to the main digital input signal in the digital domain. Dither signals are typically smaller than the main digital input signal, and can be in any format, so long as they don't interfere with the main digital input signal. In the above example of an exaggerated LSB/MSB ratio mismatch, a simulation will reveal abrupt steps at the points where n MSBs switch to n+1 MSBs (and the LSBs switch from all on to all off). Even if the LSB/MSB ratio cannot be corrected, the average transfer function of the DAC can be improved by randomizing the values of the digital input at which the abrupt steps appear. Dither performs this function. For example, a simple sinusoidal dither at another frequency can be added to the main digital input signal before the DAC. This can modify the points where the MSB count changes and the steps occur. It adds a tone in the frequency domain, but the tone can often be located either above or below the frequency band of the main signal. One way to resolve the tone resulting from dither added to the digital input signal is by removing the tone via an analog filter at the output node 108 of the first DAC.

For dither, signals with less regularity are generally preferred, both because they randomize the DAC digital input better and because they may be easier to filter out. There are varieties of dither, including triangle waves, chirps, multi-tones, and any of these could have pseudo-random parameters to spread the dither and make it easier to avoid interfering with the main signal. Dither described herein may be L-bit pseudo-random dither, where L is a quantity of the LSB bits of a digital input. As noted, one way to keep the dither from interfering with the desired analog output is to filter it out with an analog filter.

As described above, a first DAC 105 in FIG. 1 includes segmented groups of first current sources 121-127, i.e., that are segmented into a first group of first current sources 125-127 and a second group of first current sources 121-124. The first group of first current sources 125-127 are based on the values of the (2) MSB bits and permuted so that the use of the first current sources 125-127 is pseudo-randomly varied. Moreover, dither is added to the digital input that includes the four (4) LSB bits and (2) MSB bits. Thus, the first DAC 105 provides a proper context for a circuit that includes the first DAC 105 and a second DAC as set forth below.

Figure 2:
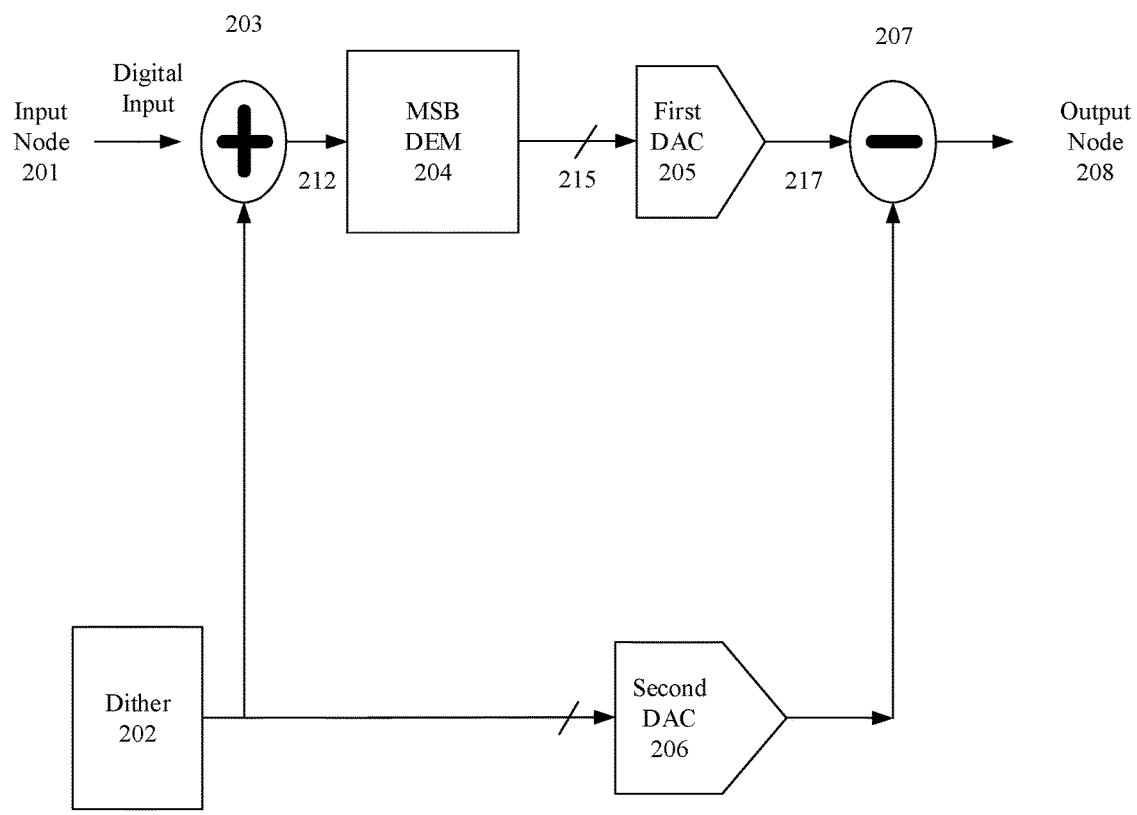
FIG. 2 illustrates a diagram of a circuit that uses least significant bit dynamic element matching in a digital-to-analog converter, in accordance with a representative embodiment.

FIG. 2 illustrates a diagram of a circuit that uses least significant bit dynamic element matching in a digital-to-analog converter, in accordance with a representative embodiment. In FIG. 2, a circuit includes input node 201 and output node 208, along with nodes 212, 215 and 217 between various elements including a digital adder 203, analog subtractor 207, MSB DEM 204, first DAC 205 and second DAC 206. Dither 202 is added to digital input at the input node 201 by the digital adder 203. Permutation is performed by MSB DEM 204, to vary which current sources of the first DAC 205 are used to provide current based on MSB bits of the digital input provided at the input node 201. The first DAC 205 in FIG. 2 may identically or similarly correspond to the first DAC 105 in FIG. 1, and may vary based on, for example the number of LSB bits and the number of MSB bits from digital input, as well as the number of current sources provided for the LSB bits and the MSB bits.

In FIG. 2, the dither 202 from a digital dither source is added to the digital input at the input node 201 by the digital adder 203 is also provided to the second DAC 206. The dither 202 may be the sole digital input to the second DAC 206, whereas the dither 202 merely supplements the digital input from the input node 201 provided to the first DAC 205. Therefore, the dither is converted from digital input to analog output by the second DAC 206, and then subtracted from the output of the first DAC 205 at the output node 208 by the analog subtractor 207

In FIG. 2, the MSB bits and LSB bits of the digital input from the digital adder 203 are provided to the first DAC 205. The dither 202 added to the digital input by the digital adder 203 may be L-bit pseudo-random dither, where L is the quantity of the MSB bits. The dither 202 is generated and added to the data stream of the digital input by the digital adder 203. MSB permutation is performed on the MSB bits at 204.

The dither 202 is also sent to the second DAC 206. The second DAC 206 only uses current sources for the LSB bits, and may not even have current sources for MSB bits. As noted, the sole digital input to the second DAC 206 is the dither 202, and the analog output of the second DAC 206 is subtracted from the analog output of the first DAC 205 at the output node 208 by the analog subtractor 207. Now the dither 202 has been added at the input node by the digital adder 203 and subtracted at the output node 208 by the analog subtractor 207, so the dither 202 is cancelled out. Nevertheless, the arrangement of current sources used for MSB bits of a given input code for the embodiment of FIG. 2 has been randomized, as is also true of which LSB current sources are turned on for a given input code.

In an embodiment that is alternative to the embodiment of FIG. 2, dither can be subtracted at the input to the first DAC 205. In another embodiment, dither can be inverted at the input to the second DAC 206, and then added (rather than subtracted) to the analog output by an adder (not shown) at output node 208.

Figure 3:
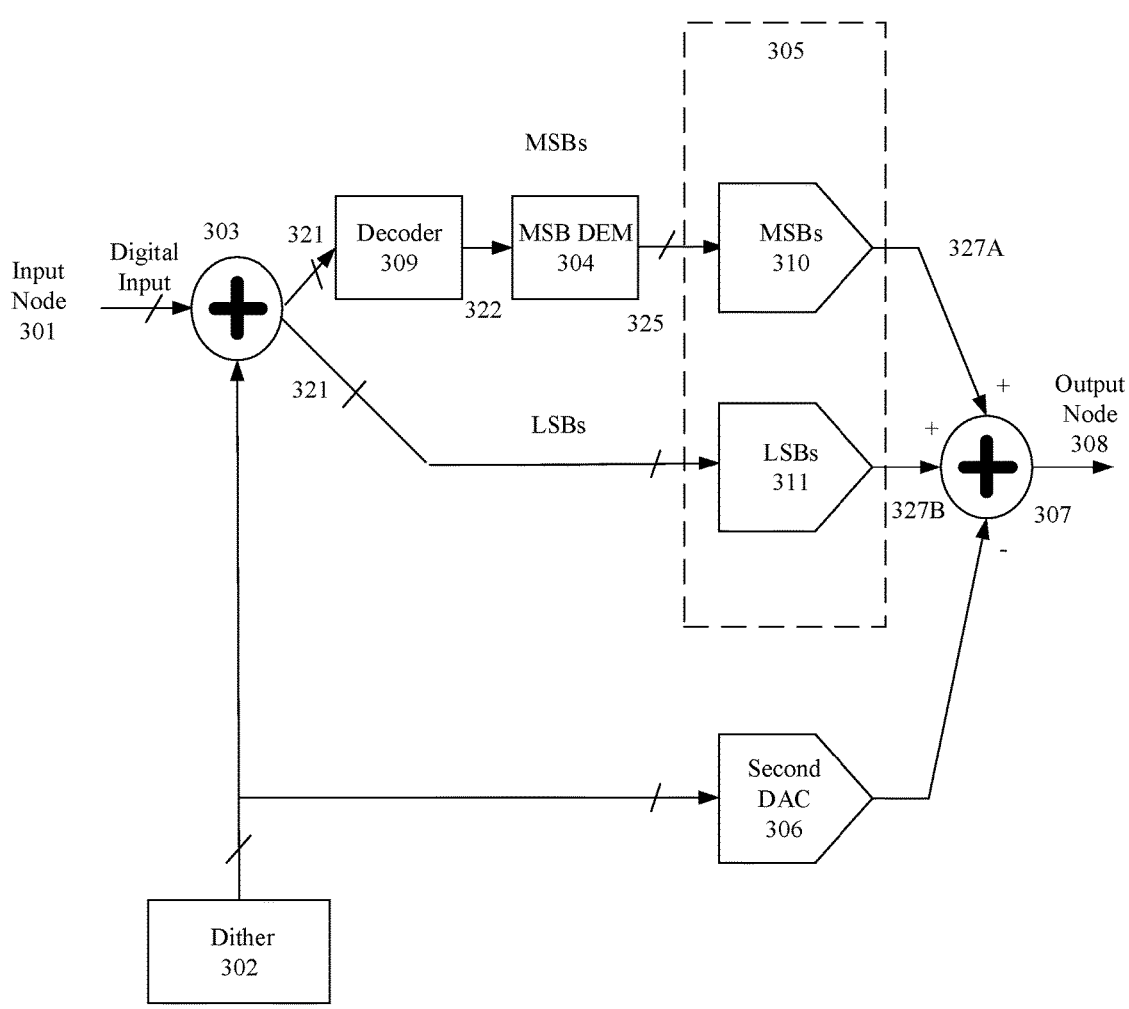
FIG. 3 illustrates another diagram of a circuit that uses least significant bit dynamic element matching in a digital-to-analog converter, in accordance with a representative embodiment.

FIG. 3 illustrates another diagram of a circuit that uses least significant bit dynamic element matching in a digital-to-analog converter, in accordance with a representative embodiment. In FIG. 3, a circuit includes input node 301, output node 308, and nodes 321, 322, 325, 327A and 327B between various elements including decoder section 309, MSB DEM 304, a first DAC 305 with MSB section 310 and LSB section 311, a second DAC 306, a digital adder 303 and an analog summer 307. In FIG. 3, digital input at the input node 301 is provided to the digital adder 303. LSB bits of the digital sum at the node 321 from the digital adder 303 are treated by LSB section 311 of the first DAC 305. Decoder section 309 determines the value of MSB bits of the digital sum at the node 321 from the digital adder 303, to determine the number of current sources required for use at the MSB section 310 of the first DAC 305. Permutation for the selection of current sources is provided at MSB DEM 304, and the current for the MSB bits of the digital input is generated by the selected current sources of the MSB section 310 of the first DAC 305. The dither 302 is added at the digital adder 303 to the digital input from the input node 301, and the dither is provided as the sole digital input to the second DAC 306. The analog summer 307 receives the analog output of the MSB section 310 of the first DAC 305, the analog output of the LSB section 311 of the first DAC 305, and the analog output of the second DAC 306. The analog summer 307 subtracts the analog output of the second DAC 306 from the analog output of the first DAC 305. The analog summer 307 outputs at output node 308 the analog output that results from the subtraction at the analog summer 307.

FIG. 3 shows an expansion of FIG. 2 but with the LSB section 311 and MSB section 310 specified for the first DAC 305. The LSB section 311 of the first DAC 305 matches the second DAC 306, and both convert the dither 302 as digital LSB bits, solely by the second DAC 306, and together with the LSB bits provided to the LSB section 311 by the first DAC 305.

FIG. 3 does not detail the current sources and switches shown in, for example, FIG. 1. However, in the embodiment of FIG. 3, the first DAC 305 may include binary-weighted current sources in the LSB section 311, and equal-weighted/unary-weighted current sources in MSB section 310. Additionally, the second DAC 306 may include only binary-weighted current sources that match the current sources in the LSB section 311 of the first DAC 305.

Figure 4:
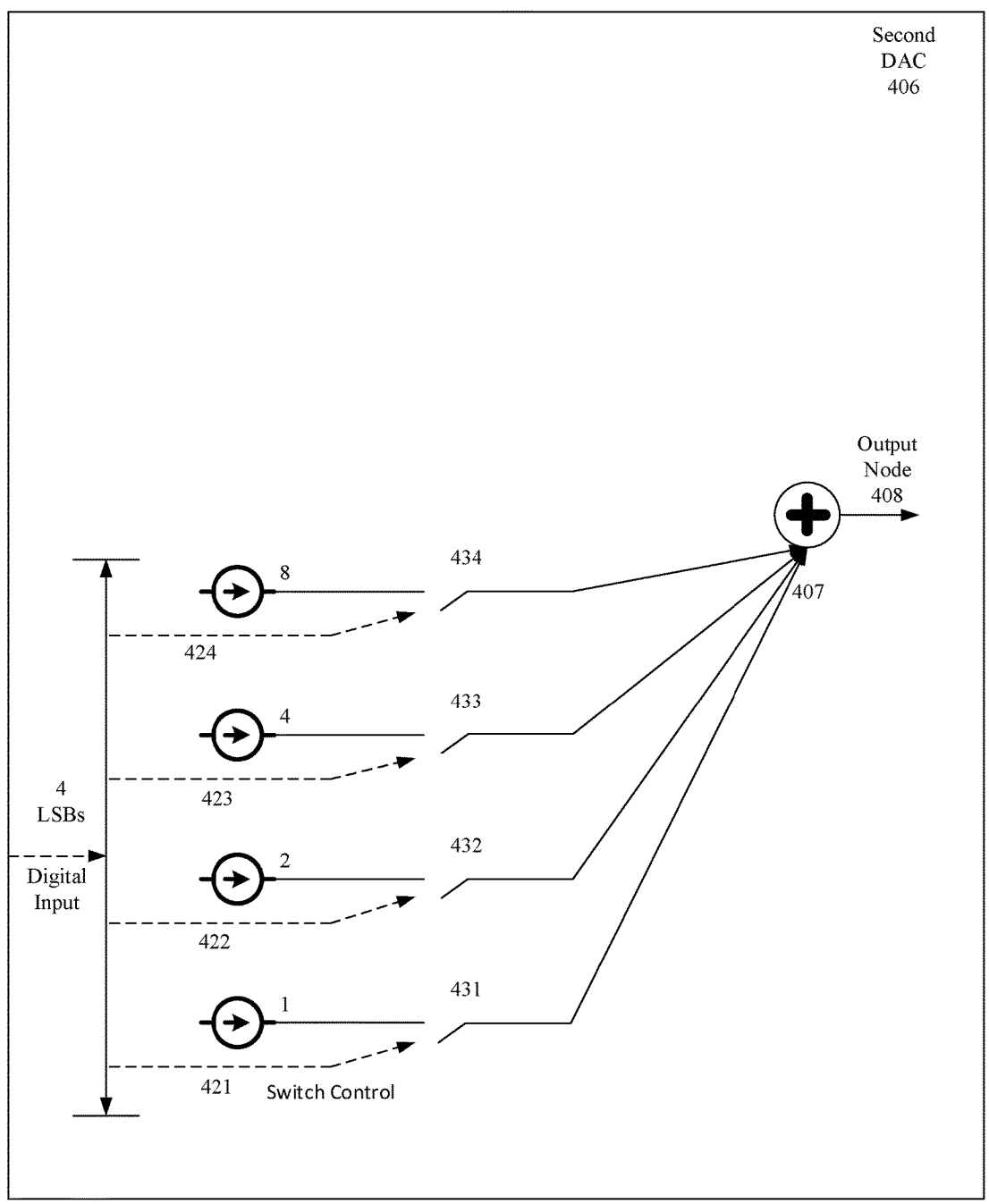
FIG. 4 illustrates a diagram of a second digital-to-analog converter used in least significant bit dynamic element matching in a digital-to-analog converter, in accordance with a representative embodiment.

FIG. 4 illustrates a diagram of a second digital-to-analog converter used in least significant bit dynamic element matching in a digital-to-analog converter, in accordance with a representative embodiment. In FIG. 4, a second DAC 406 includes second current sources 421-424 that are each binary-weighted and linked to a corresponding switch among switches 431-434. When any switch among switches 431-434 is closed, the closed switch provides current from the corresponding current source among second current sources 421-424 to summer 407, which in turn provides analog output 408.

In FIG. 4, switch control bits are represented by the dashed lines and arrows pointing to each switch among switches 431-434. The switch control bits may be the bits of digital input provided to a circuit that includes the second DAC 406, and the bit values may be individually provided to control each switch among switches 431-434 based on the bit position of the bit in the digital input. For example, the least significant bit of the digital input may be provided to control switch 431. The second least significant bit of the digital input may be provided to control switch 432. The third least significant bit of the digital input may be provided to control switch 433. And the fourth least significant bit of the digital input may be provided to control switch 434.

In FIG. 4, each current source among second current sources 421-424 provides a fixed amount of current. The second current sources 421-424 are binary-weighted, and the binary weightings are shown at the outputs of each current source among second current sources 421-424. As shown, the current from current source 421 is weighted "1", the current from current source 422 is weighted "2", the current from current source 423 is weighted "4", and the current from current source 424 is weighted "8".

In detail, the second DAC 406 may include a positive node and a negative node. When any of the switches 431-434 are closed, the current provided over the closed switch is provided to the positive node. When any of the switches 431-434 are open, the current from the corresponding current source among second current sources 421-424 is carried to the negative node.

The second current sources 421-424 of the second DAC 406 may match the first current sources 121-124 of the first DAC 105 in FIG. 1. The second DAC 406 may be representative of the second DAC 206 in the circuit of FIG. 2, and the first DAC 105 may be representative of the first DAC 205 in the circuit of FIG. 2. The second DAC 406 may also be representative of the second DAC 306 in FIG. 3, and the first DAC 105 may be representative of the first DAC 305 in the circuit of FIG. 3. As a reminder, the second group of first current sources 121-124 in FIG. 1 also included four (4) current sources for four (4) LSB bits, and thus the quantity of the second group of first current sources 121-124 is equal to the quantity of four (4) LSB bits. The second current sources 421-424 also includes four (4) current sources for four (4) LSB bits that represent the dither, and thus the quantity of the second current sources 421-424 is equal to the quantity of four (4) LSB bits.

The features of FIGS. 1-4 may be integrated as a single embodiment described as follows. As shown in each of FIGS. 2-3, a circuit for digital-to-analog conversion can include a first DAC 205, 305, a second DAC 206, 306, and an output node 208, 308. As detailed in FIG. 1, a first DAC 105 provides currents from first current sources 121-127 segmented into a first group for MSB bits of a digital input to the first DAC and a second group for LSB bits of the digital input. As shown also in FIG. 1, the first group includes first current sources 125-127, and the second group includes first current sources 121-124. As shown in FIGS. 2-3, dither is both added to the digital input to the first DAC 205, 305 and used as sole digital input to the second DAC 206, 306. Analog output from the second DAC 206, 306 is subtracted from analog output of the first DAC at the output node 208, 308 so as to cancel the dither added to the first DAC 205, 305. Additionally, the above features described as a circuit in a single integrated embodiment based on FIGS. 1-4 may also be alternatively described as a method performed by a circuit for digital-to-analog conversion.

An alternative way to describe the features of FIGS. 1-4 as an integrated embodiment is as follows. As shown in each of FIGS. 2-3, a circuit for digital-to-analog conversion can include a first DAC 105, 205, 305, a second DAC 206, 306, and an output node 208, 308. As detailed in FIG. 1, the first DAC 205 provides currents from first current sources 121-127 based on digital input received by the first DAC 205. As also shown in FIG. 1, multiple switches 131-137 variably provide the currents from the first current sources 121-127 in accordance with the digital input received by the first DAC 205. Bits of the digital input are permuted as shown by, for example, MSB DEM 204, 304 in FIGS. 2-3, to vary which of the first current sources 121-127 provide the currents. As detailed in FIG. 4, the second DAC 406 provides currents from multiple second current sources 421-424. Dither is both added to the digital input received by the first DAC 105, 205, 305 and used as sole digital input to the second DAC 206, 306, 406. The dither is subtracted at the output node 208, 308 when the currents from the first current sources 121-127 are combined with the currents from the second current sources 421-424.

FIGS. 1-4 are described as including two (2) different weightings for current sources, i.e., binary-weighting for first current sources 121-124 and second current sources 421-424, and equal-weighting for first current sources 125-127. Each of the first current sources 125-127 provides an equal amount of charge. However, in alternative embodiments, the weightings for current sources may all be the same, either all binary-weighting or all equal-weighting. A second DAC can be used to cancel dither added to digital input received by a first DAC in such a circumstance. Moreover, although not particularly specified for each FIG. among FIGS. 1-4, the first DAC 105 and second DAC 406 are typically implemented as the only DACs in the circuits for digital-to-analog conversion described herein. As a reminder, one of the reasons the second DAC 404 might be used as described herein is to reduce or eliminate any need to provide an external analog filter to filter out the analog dither at the DAC output, and as a general matter the minimization of size and quantity of circuit elements is useful in meeting industry demands for smaller and smaller products.

Figure 5:
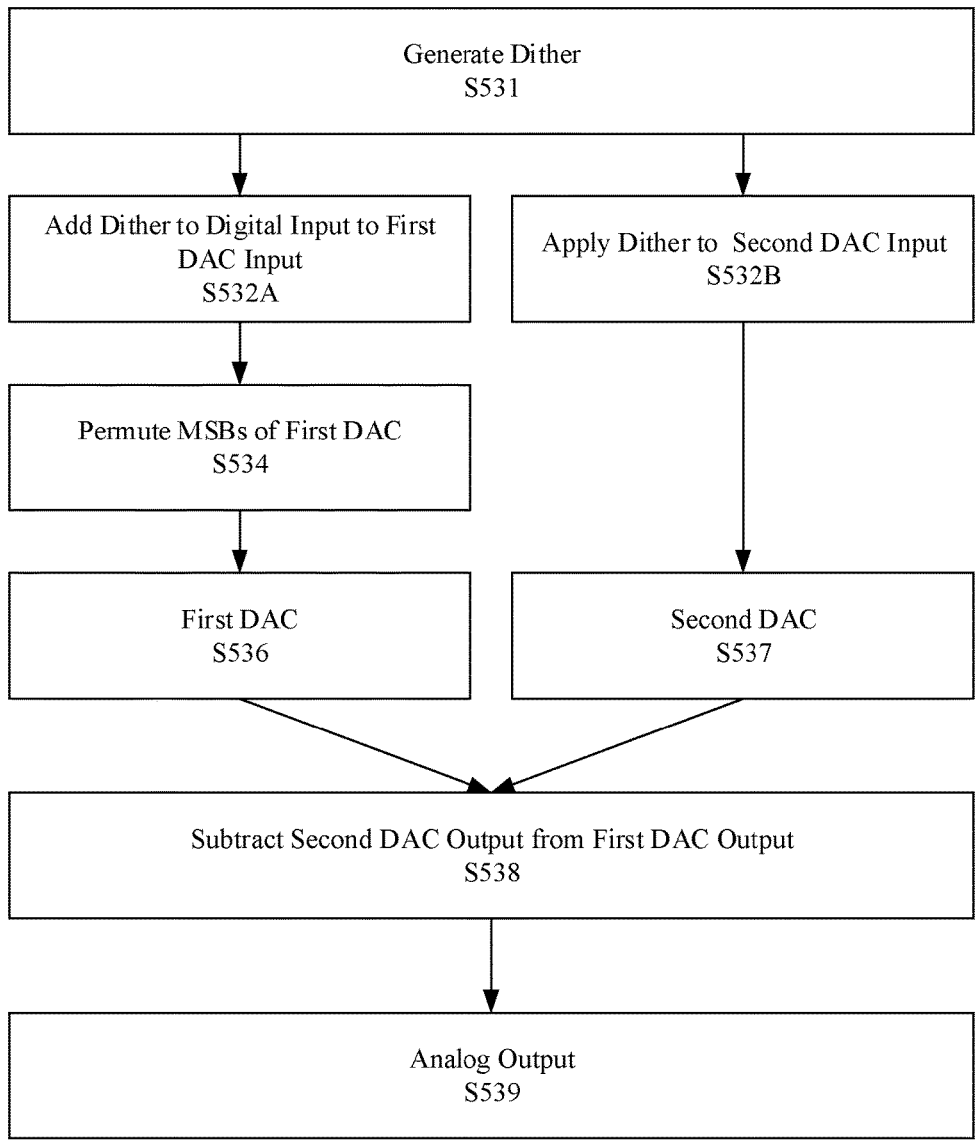
FIG. 5 illustrates a flow diagram for least significant bit dynamic element matching in a digital-to-analog converter, in accordance with a representative embodiment.

FIG. 5 illustrates a flow diagram for least significant bit dynamic element matching in a digital-to-analog converter, in accordance with a representative embodiment. In FIG. 5, dither is generated at S531. For example, the dither may be generated by a pseudo-random number generator.

At S532A, the dither is added to digital input and applied to a first DAC input, and at S532B the dither is applied to a second DAC input. The first DAC may be the first DAC 105 of FIG. 1, the first DAC 205 of FIG. 2, or the first DAC 305 of FIG. 3. The second DAC may be the second DAC 206 of FIG. 2, the second DAC 306 of FIG. 3, or the second DAC 406 of FIG. 4.

At S534, the MSB bits of the digital input are permuted. The MSB bits are permuted to randomize the current sources used to generate analog current for the MSB bits in the first DAC (e.g., first DAC 105, first DAC 205, or first DAC 305).

At S536, the digital input and the dither are applied to the first DAC (e.g., first DAC 105, first DAC 205, or first DAC 305). At S537, the dither is provided as the sole digital input to the second DAC (e.g., the second DAC 206, the second DAC 306, or the second DAC 406).

At S538, analog output from the second DAC (e.g., second DAC 206, second DAC 306, or second DAC 406) is subtracted from analog output of the first DAC (e.g., first DAC 105, first DAC 205, or first DAC 305). At S539, analog output is provided from an output node of a circuit that includes the first DAC and second DAC. The output at S539 represents the analog output of the first DAC based on the digital input to the entire circuit.

Figure 6:
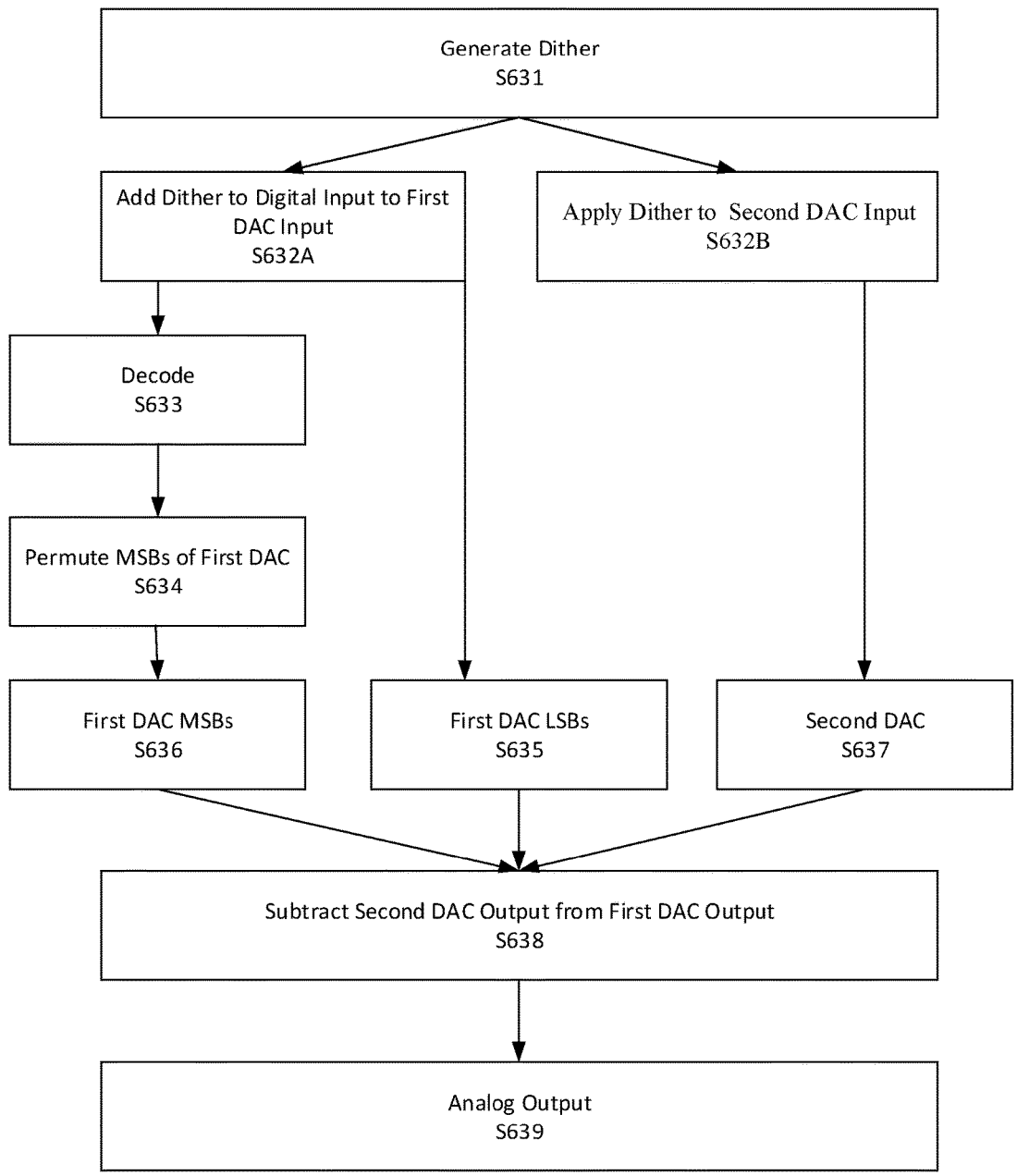
FIG. 6 illustrates another flow diagram for least significant bit dynamic element matching in a digital-to-analog converter, in accordance with a representative embodiment.

FIG. 6 illustrates another flow diagram for least significant bit dynamic element matching in a digital-to-analog converter, in accordance with a representative embodiment. In FIG. 6, dither is generated at S631. The dither is applied to digital input to a first DAC at S632A and as the sole digital input to a second DAC at S632B. At S633, the digital input is decoded. That is, at S633, the MSB bits of the digital input to the first DAC are analyzed to determine the bit values of each MSB bit, to determine the number of current sources to be used for the MSB bits. At S634, the MSB bits of the first DAC are permuted, to, e.g., pseudo-randomly or randomly, select the set or a subset of dedicated current sources for the MSB bits to use in providing the analog output for the MSB bits. At S636, current from dedicated current sources for the first DAC MSB bits is provided over closed switches such as switches 135-137 in FIG. 1. At S635, current from dedicated first current sources for the first DAC LSB bits is provided over closed switches such as switches 131-134 in FIG. 1. At S637, current from second current sources of the second DAC are provided over closed switches such as switches 431-434 in FIG. 4. Thus, the switches 131-134 and 431-434 provided charges. At S638, the analog output from the second DAC is subtracted from analog output from the first DAC. As a result, dither added to the digital input at S632A is subtracted from the corresponding analog output at S638. At S639, the analog output is output via an output node.

Figure 7:
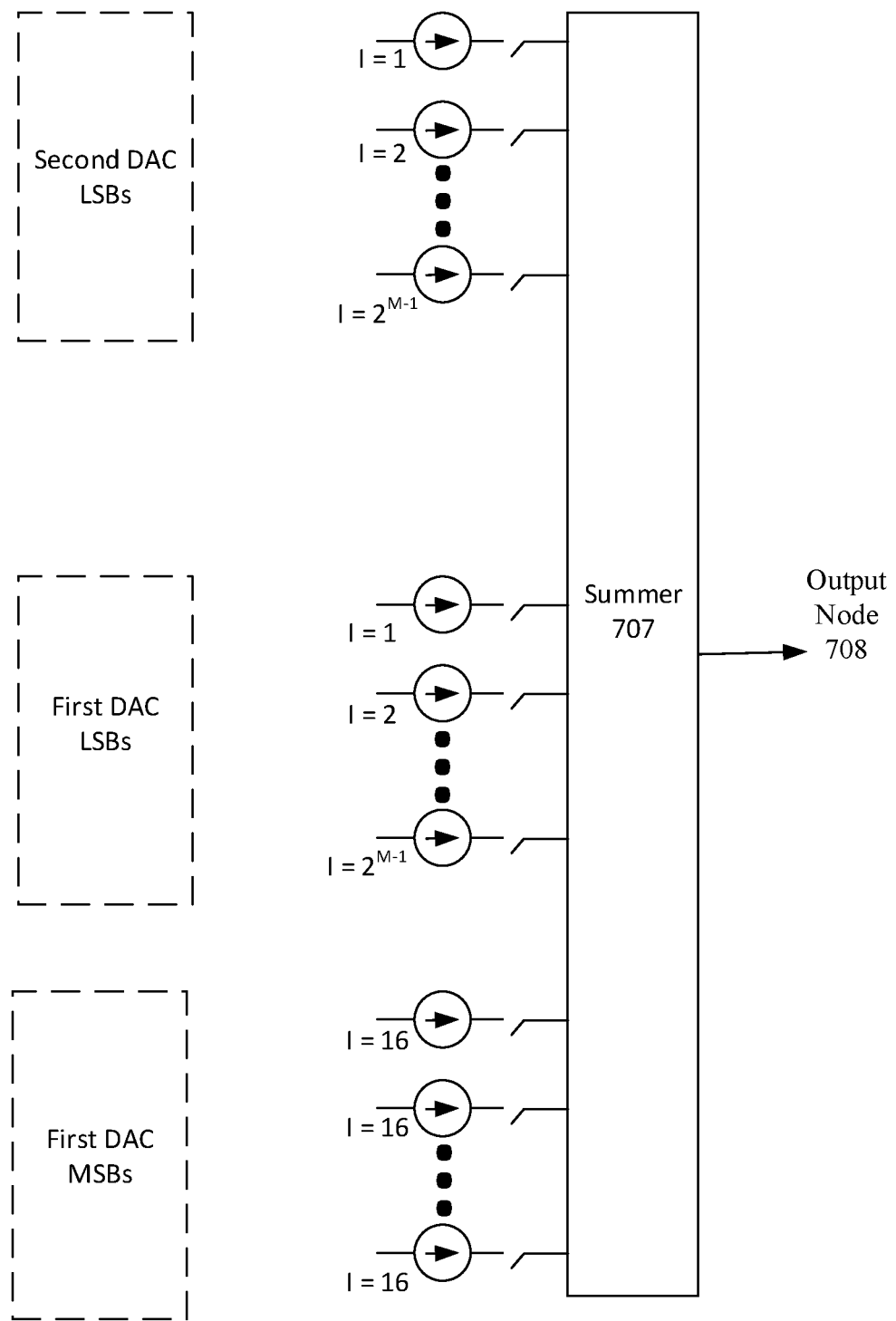
FIG. 7 illustrates another diagram of a circuit used in least significant bit dynamic element matching in a digital-to-analog converter, in accordance with a representative embodiment.

FIG. 7 illustrates another diagram of a circuit used in least significant bit dynamic element matching in a digital-to-analog converter, in accordance with a representative embodiment. In FIG. 7, three (3) groups of current sources are shown providing current to a summer 707 to output via an output node 708. The three (3) groups of current sources correspond respectively to MSB bits for a first DAC, LSB bits for the first DAC, and LSB bits for a second DAC that match the LSB bits for the first DAC. As shown, the current sources for the MSB bits for the first DAC are all equal-weighted/unary-weighted. On the other hand, all current sources for the LSB bits of both the first DAC and the second DAC are binary-weighted. The binary weighting is shown as a progression from I=1, to I=2, to I=$2^{N-1}$, where N is the number of LSB bits being binary-weighted.

In FIG. 7, the summer 707 collects currents from the first DAC current sources and the second DAC current sources. Although only three (3) current sources are shown for each of the three (3) groups in FIG. 7, more than or fewer than three (3) current sources may be used for any of these groups. For example, if a 6-bit digital input includes three (3) LSB bits and three (3) MSB bits, the number of current sources for the first DAC LSB bits would be 3, but the number of dedicated current sources for the first DAC MSB bits could be seven (7), i.e., ($2^M-1=2^3-1$), or another number close to the exponential result. The number of current sources for the second DAC are matched to the number of current sources for the first DAC LSB bits, and these two (2) groups will have the same number of dedicated current sources, at least for any individual digital input.

Figure 8A:
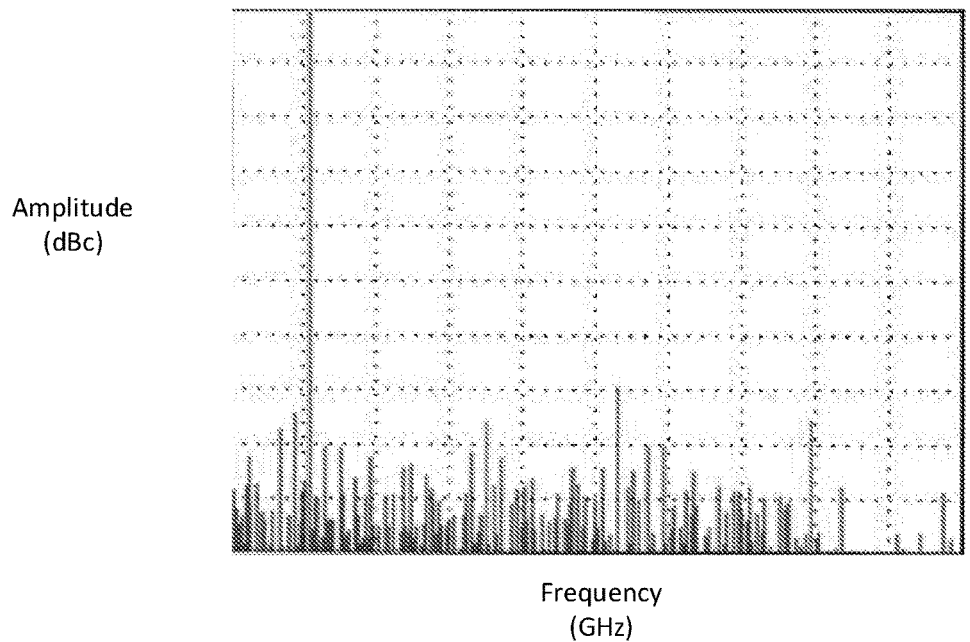
FIGS. 8A and 8B illustrate comparative spurs for a circuit that uses least significant bit dynamic element matching in a digital-to-analog converter and a circuit that does not, in accordance with a representative embodiment.
Figure 8B:
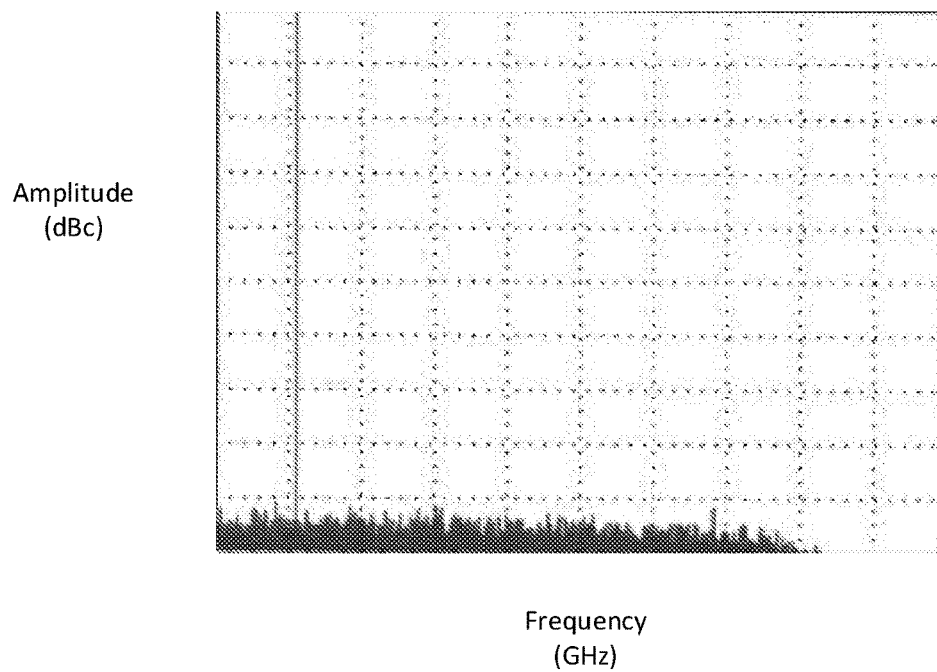

FIGS. 8A and 8B illustrate comparative spurs for a circuit that uses least significant bit dynamic element matching in a digital-to-analog converter and a circuit that does not, in accordance with a representative embodiment.

FIG. 8A illustrates spurs due to an LSB/MSB ratio mismatch for a circuit that does not use the teachings of the present disclosure including matching LSB bit current sources in a first DAC with LSB bit current sources in a second DAC. FIG. 8B illustrates spurs due to the same LSB/MSB ratio mismatch as in FIG. 8A, but using the teachings of the present disclosure including matching LSB bit current sources with LSB bit current sources in a second DAC. As shown in FIG. 8B, the spurs are suppressed by over 20 dB. The error energy has not gone away; rather, in this simulation without thermal noise, the noise floor is visibly higher. In many cases, however, other noise contributors dominate and the added noise energy is not significant. Of course, the spur reduction is not limited to 20 dB; this is just the limit of a specific simulation. Longer simulations (equivalent to a smaller resolution bandwidth in a spectrum analyzer) would drive down the noise floor by averaging. In principle, the spurs are now completely suppressed.

As described above, using a second DAC 406 to remove dither added to digital input to a first DAC 105 reduces spurs resulting from LSB/MSB ratio mismatch in a circuit where the first DAC 105 has first current sources 121-127 that are segmented. In a segmented DAC with both binary-weighted and equal-weighted current sources, the ratio between the largest and smallest current sources is reduced compared to a DAC with only binary-weighted current sources, and the segmented DAC therefore improves linearity. Mismatch errors that still appear are suppressed then by the permuting/DEM described herein, so that mismatch between MSB current sources is averaged out. However, errors from current sources dedicated to LSB bits in a digital input remain, along with residual effects of the MSB mismatch. The LSB errors shown in FIG. 8A in a simulation are then substantially addressed by using the dither added to the digital input to the first DAC 105, and as the sole input to the second DAC 406, and then cancelling the dither by subtracting the analog output of the second DAC 406 from the analog output of the first DAC 105. The output of the first DAC 105 and the second DAC 406 are thus differential signals The improvement in reducing undesirable effects of linearity and LSB/MSB ratio mismatch can thus be achieved as a symbiotic effect of using the equal-weighed current sources and segmenting, the permuting/DEM, the dither, and the second DAC in the manner described herein. Thus, the comparative improvement shown in FIG. 8B is attributable to the combination of factors described herein.

Accordingly, least significant bit dynamic element matching in a digital-to-analog converter provides an ability to avoid using an external analog filter that would otherwise be used to remove the analog output corresponding to dither added to the digital input.

As explained above, dither can be added to digital DAC input, and then removed without requiring an analog filter at the DAC output. The present disclosure provides mechanisms that help avoid any requirement for an analog filter at the DAC output to remove dither added at the digital DAC input.

Although least significant bit dynamic element matching in a digital-to-analog converter has been described with reference to several exemplary embodiments, it is understood that the words that have been used are words of description and illustration, rather than words of limitation. Changes may be made within the purview of the appended claims, as presently stated and as amended, without departing from the scope and spirit least significant bit dynamic element matching in a digital-to-analog converter in its aspects. Although least significant bit dynamic element matching in a digital-to-analog converter has been described with reference to particular means, materials and embodiments, least significant bit dynamic element matching in a digital-to-analog converter is not intended to be limited to the particulars disclosed; rather least significant bit dynamic element matching in a digital-to-analog converter extends to all functionally equivalent structures, methods, and uses such as are within the scope of the appended claims.

For example, another comparable DAC topology uses an R-2R ladder to provide binary weighting for the LSB bits. The teachings of the present disclosure are entirely applicable to this alternative DAC topology.

Additionally, while the disclosure herein generally describes using a second DAC to cancel dither added to a first DAC, any number of DACs are contemplated for use in the same manner even though this may complicate the design. For example, digital inputs to three (3) or more DACs may be linear combinations of data and dither, and outputs of the DACs can be added or subtracted as appropriate such that the dither is cancelled out and the analog output is a linear representation of the data.

The illustrations of the embodiments described herein are intended to provide a general understanding of the structure of the various embodiments. The illustrations are not intended to serve as a complete description of all the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any individual invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment to streamline the disclosure. This disclosure is not to be interpreted as reflecting an intention that the claimed embodiments require more features than are expressly recited in each claim. Rather, as the following claims reflect, inventive subject matter may be directed to less than all features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed:

1. A circuit for digital-to-analog conversion, comprising:
a first digital-to-analog converter (DAC) that provides charges from a plurality of first charge sources segmented into a first group for most significant bits of a digital input to the first DAC and a second group for least significant bits of the digital input;
a plurality of first switches each corresponding to a different one of the plurality of first charge sources and variably providing charge from the different one of the plurality of first charge sources based on the digital input;
a second DAC;
a digital dither source; and
an output node,
wherein dither from the digital dither source is both added to the digital input to the first DAC, and used as sole digital input to the second DAC, and
analog output from the second DAC is subtracted from analog output of the first DAC at the output node so as to cancel the dither added to the first DAC.

2. The circuit of claim 1,
wherein the first charge sources of the first group for the most significant bits are equal-weighted, and
the first charge sources of the second group for the least significant bits are binary-weighted.

3. The circuit of claim 2,
wherein a set of charge sources of the first charge sources used for a digital input of a first sample can vary from a set of charge sources of the first charge sources used for the same digital input of a second sample.

4. The circuit of claim 1, further comprising:
the plurality of charge sources,
wherein the charge sources comprise current sources.

5. The circuit of claim 2,
wherein the second DAC provides charges from a plurality of second charge sources, and
a quantity of the second charge sources is equal to a quantity of the first charge sources of the second group for the least significant bits.

6. The circuit of claim 5,
wherein the second charge sources and the second group of the first charge sources are binary-weighted.

7. The circuit of claim 5,
wherein the circuit comprises an integrated circuit.

8. The circuit of claim 1,
wherein the analog output of the first DAC and the analog output of the second DAC are differential signals.

9. The circuit of claim 1,
wherein the second DAC adds charges from second switches controlled by the sole digital input to the second DAC.

10. The circuit of claim 1,
wherein the dither comprises L-bit pseudo-random dither, where L is a quantity of the least significant bits.

11. The circuit of claim 1,
wherein the second DAC provides charges from a plurality of second charge sources;
the second group of the plurality of first charge sources are not binary-weighted; and
the plurality of second charge sources are not binary-weighted.

12. The circuit of claim 1,
wherein each of the first charge sources of the first group provides an equal amount of charge.

13. The circuit of claim 1,
wherein the circuit is configured to permute bits of digital input used to control first charge sources of the first group for each digital input.

14. A method for digital-to-analog conversion, comprising:
receiving, by a first digital-to-analog converter (DAC), a digital input;
adding dither to the digital input received by the first DAC;
receiving, by a second DAC, the dither as sole digital input to the second DAC;
providing, by the second DAC and based on the dither, charges from a plurality of second charge sources;
providing, by the first DAC and based on the digital input and the dither added to the digital input, charges from a plurality of first charge sources segmented into a first group for most significant bits of the digital input received by the first DAC and a second group for least significant bits of the digital input; and
subtracting, at an output node, analog output from the second DAC from analog output from the first DAC so as to cancel the dither added to the digital input received by the first DAC.

15. The method of claim 14,
wherein the first DAC adds charges from switches controlled by the digital input received by the first DAC, and
the second DAC adds charges from switches controlled by the sole digital input to the second DAC.

16. The method of claim 14,
wherein the charges from the plurality of first charge sources are switched between a first positive node and a first negative node of the first DAC; and
the charges from the plurality of second charge sources are switched between a second positive node and a second negative node of the second DAC.

17. The method of claim 14,
wherein a set of charge sources of the first charge sources used for a digital input of a first sample can vary from a set of charge sources of the first charge sources used for the same digital input of a second sample.

18. The method of claim 14,
wherein the first charge sources of the first group for the most significant bits are equal-weighted,
the first charge sources of the second group for the least significant bits are binary-weighted, and
the second charge sources are binary-weighted.

19. The method of claim 14,
wherein the dither comprises L-bit pseudo-random dither, where L is a quantity of the least significant bits.

20. A circuit for digital-to-analog conversion, comprising:
a first digital-to-analog converter (DAC) that provides a first analog output signal proportional to a digital input code that is input to the first DAC;
a second DAC with a smaller input code range than the first DAC and that provides a second analog output signal; and
a digital dither source;
wherein dither is both added to the digital input received by the first DAC and used as sole digital input to the second DAC, and
the dither is cancelled at an output node when the first analog output signal from the first DAC is combined with the second analog output signal from the second DAC.

* * * * *